United States Patent [19]

Meïjer et al.

[11] Patent Number: 4,956,239
[45] Date of Patent: Sep. 11, 1990

[54] POLY-1,2-AZEPINE, METHOD OF PRODUCING A FILM OF SUCH A POLYMER ON A SUBSTRATE AND A SUBSTRATE PROVIDED WITH SUCH A POLYMER

[75] Inventors: Egbert W. Meïjer; Franciscus C. B. M. Van Vroonhoven; Jozef H. H. Nijhuis, all of Eindhoven, Netherlands

[73] Assignee: U.S. Philips Corporation, New York, N.Y.

[21] Appl. No.: 175,070

[22] Filed: Mar. 30, 1988

[30] Foreign Application Priority Data

Apr. 27, 1987 [NL] Netherlands ............... 8700986

[51] Int. Cl.$^5$ ............... B05D 3/06; B32B 9/04
[52] U.S. Cl. ............... 428/411.1; 427/54.1; 427/58; 427/99; 427/108; 427/255.6; 427/282; 427/341; 428/426; 428/422; 428/423
[58] Field of Search ............... 427/255.6, 341, 282, 427/54.1, 99, 58, 108; 428/411.1, 426; 528/423, 422

[56] References Cited

U.S. PATENT DOCUMENTS 3,975,331 8/1976 Spiewak ............... 260/78 R
4,423,182 12/1983 Bartman ............... 324/367

OTHER PUBLICATIONS

Jones, W. M., "Rearrangements of Carbenes and Nitrenes", in *Rearrangements in Ground and Excited States*, vol. 1, Academic Press, N.Y., 1980, pp. 95-160.
Smith, P. A. S., "Aryl and Heteroaryl Azides and Nitrenes", in *Azides and Nitrenes*, Academic Press, San Diego, 1984, pp. 95-201.
A. Beiser, *J. Am Chem. Soc.*, 93, 4051 (1971).

*Primary Examiner*—Janyce Bell
*Attorney, Agent, or Firm*—Norman N. Spain

[57] ABSTRACT

Gas-phase photopolymerization of phenylazides results in a new type of polymer, a poly-1,2-azepine. This polymer can be provided on a substrate according to a predetermined pattern by exposing it via a mask. After oxidation an electrically conductive polymer is obtained.

9 Claims, 1 Drawing Sheet

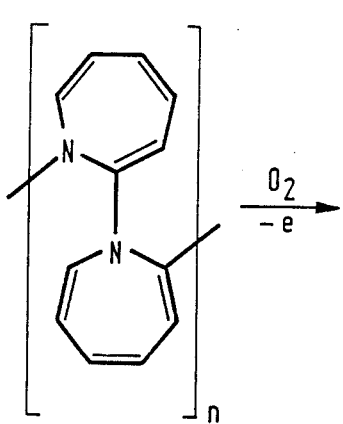
FIG.1a
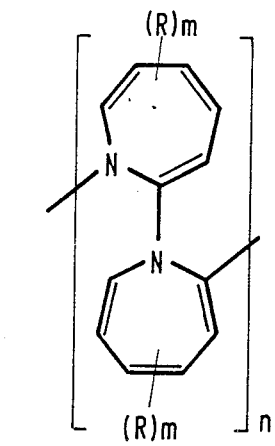
FIG.1b
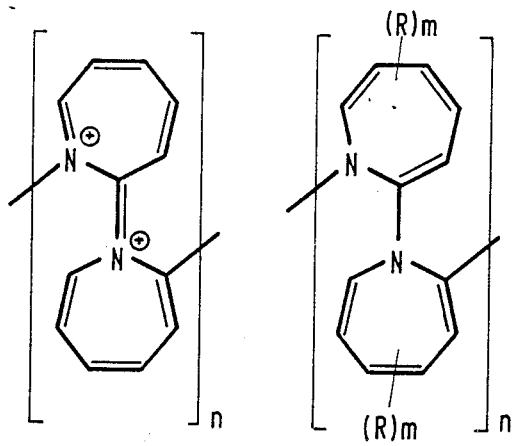
FIG.1c
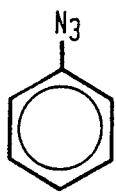
FIG.2a
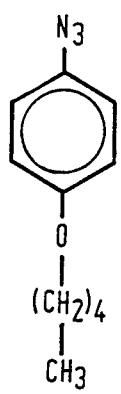
FIG.2b
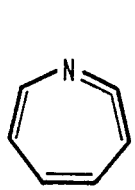 + 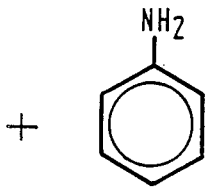 → 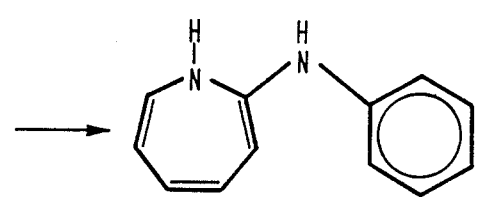
FIG.2c                                FIG.2d

POLY-1,2-AZEPINE, METHOD OF PRODUCING A FILM OF SUCH A POLYMER ON A SUBSTRATE AND A SUBSTRATE PROVIDED WITH SUCH A POLYMER

BACKGROUND OF THE INVENTION

The invention relates to polymer film particulars 1,2-azepine adapted for use in the electronics industry.

The invention also relates to a method of producing a film of such a polymer on a substrate.

The invention further relates to a substrate provided with such a polymer.

Polymer films are used in the electronics industry, among others, in the form of photoresist layers, for example, in the manufacture of integrated circuits. Moreover, they may be used in the field of integrated optics. Polymers which can be suitably doped can thus be made electrically conductive. In this process the polymer is oxidised or reduced, the positive or negative charges formed on the polymer chain being compensated by counterions.

SUMMARY OF THE INVENTION

It is an object of the invention to provide a new type of polymer which can readily be obtained in the form of a film, which can be grown in the form of a pattern and, moreover, which can be made electrically conductive.

This object is achieved according to the invention by a poly-1,2-azepine, the repeating unit of which hereinafter termed "mer", corresponds to the

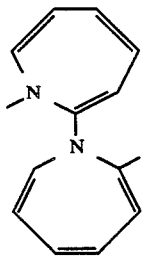

Formula 1a in which the azepine ring may be substituted.

An embodiment of the polymer according to the invention corresponds to one in which the mer is of the Formula 1c

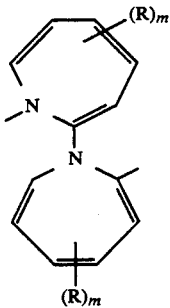

where m=0, 1, 2 or 3 and where R is a substituent selected from the group formed by alkyl, alkoxy, aryl, halogen and an electron-attracting group. Suitable substituents are, for example, methyl groups and methoxy groups. A suitable electron-attracting group is the nitro group.

In a preferred embodiment of the polymer according to the invention, the azepine ring contains one pentyloxy group in 4th position. In this embodiment the polymer obtained has a flexible character, whereas polymers having non-substituted azepine rings or having other groups of substituted azepine rings have a less flexible character.

A further object of the invention is to provide a method of producing a film of a polymer according to the invention on a substrate.

This object is achieved according to the invention by a method which is characterized in that a surface of the substrate is brought into contact with the vapour of phenylazide which maybe been substituted, after which it is exposed to UV light, such that a film of a polymer formed of mer of the Formulae 1a or 1c is formed on the surface, R and m having the above-mentioned meaning. This so-called gas-phase photopolymerisation is an attractive way of producing polymer films. Such a method is described in United States Patent Specification No. 3,518,111. In the method described therein the vapour of a substituted aromatic hydrocarbon compound, for example phenol, is brought into contact with a substrate, for example an aluminum plate, this substrate being exposed to UV light. In this process a polymer film is formed on the substrate surface by photopolymerization. This polymer film provides electrical insulation of the underlying substrate.

The use of phenylazide, whether or not, as a starting substance leads to a new type of polymer which possesses characteristics which are important to the electronics industry.

BRIEF DESCRIPTION OF THE DRAWING

In the drawing FIG. 1 is a cross-sectional view of an apparatus suitable for carrying out the method of the invention and FIG. 2 is a graph showing the relationship of polymer film absorption to UV light exposure time.

DETAILED DESCRIPTION OF THE INVENTION

Figure 3:
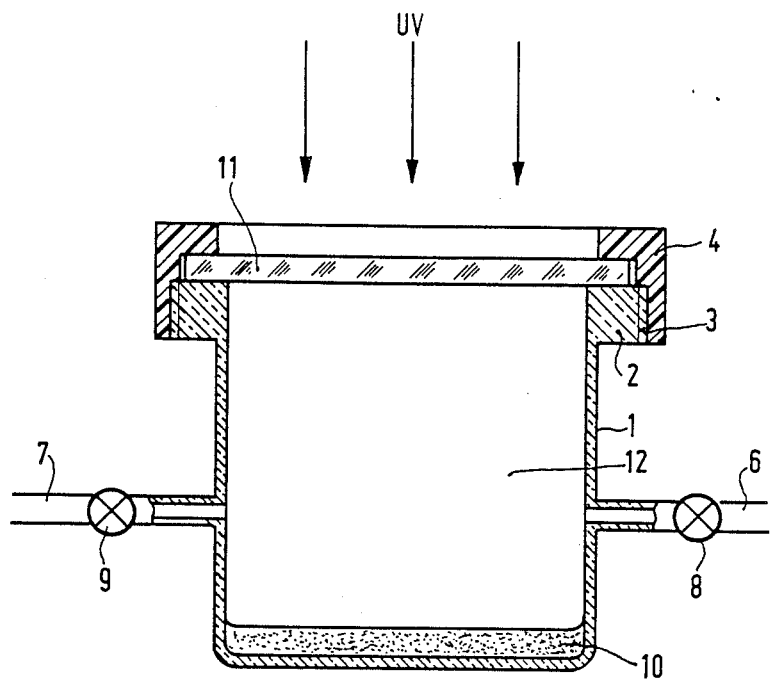
Figure 4:
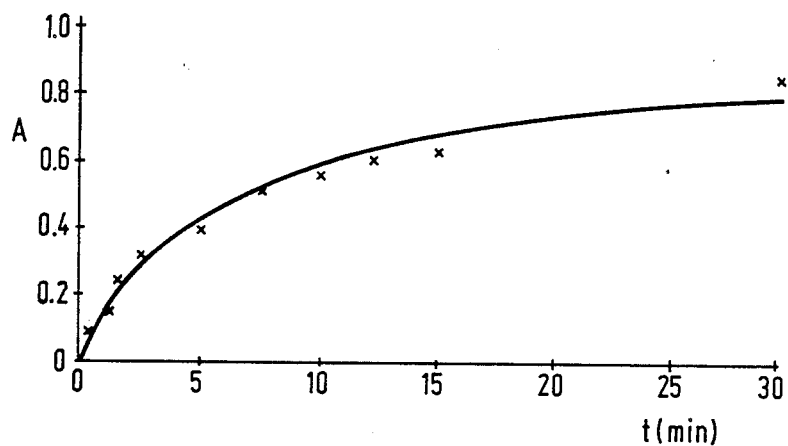

The invention will now be described in greater detail.

The article by A. Reiser et al, J. Am. Chem. Soc. This article deals with the photochemistry of phenylazide

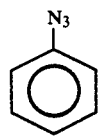

. This article deals with the formation for a tarry product which is formed when phenylazide is irradiated. This product is not further characterized. The polymer obtained according to the invention is characterized by means of UV-, IR- and NMR-spectroscopy or the structure of its mers corresponds to Formulae 1a or 1c respectively depending whether the phenylazide has substituents or not. In this respect, the reaction mechanism is as follows. By irradiation, phenylazide looses nitrogen and 1,2-dehydroazepine

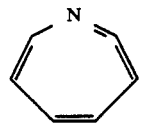

is formed via the singlet phenylnitrene and some aniline via the triplet phenylnitrene. This mechanism is described by W. M. Jones in "Rearrangements in Ground and Excited States", P. de Mayo ED., Academic Press, New York, 1980 Vol. 1, p. 95 and by P. A. S. Smith in "Azides and Nitrenes", E. F. V. Scriven Eds., Academic Press, San Diego, 1984, p. 95. It is assumed that, as a reaction initiating the polymerization, the 1,2-dehydroazepine reacts with the nucleophilic aniline to form 2-anilino-H-azepine. In the propagation step a subsequent, photochemically generated 1,2-dehydroazepine is added, etc. A 1,3-H shift is proposed as a termination reaction in which a 3 'H-azepine is formed as an end group. The structure of the polymer thus formed is, a poly-1,2-azepine having repeating units of the Formula 1c. By bringing a substrate surface into contact with phenylazide vapor and exposing it to UV light poly-1,2-azepine is formed on this surface When the exposure of the substrate is carried out from the side facing away from the vapour side it is necessary for this substrate to be sufficiently transparent to the ultraviolet light used. Suitable substrates are, for example, quartz glass, PMMA, PVDF, PET and polycarbonate. The polymerization process is preferably carried out in an inert atmosphere, for example in nitrogen. If the polymerization is carried out in an oxygen-containing atmosphere some degree of photodegradation also takes place. The poly-1,2-azepine can readily be oxidized using oxygen, in which process the radical cation according of the Formula 1b

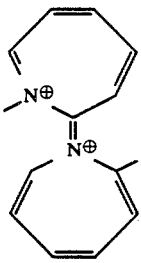

a part of the heterocyclic 7-member rings of the polymer chain is oxidized in this process. In the method according to the invention both phenylazide and substituted phenylazide may be used An embodiment of the method according to the invention is characterized in that the substituents of the phenylazide are selected from the group formed by alkyl, alkoxy, aryl, halogen and an electron attracting group. Both monosubstituted and multiplesubstituted phenylazides may be used. Suitable substituted phenylazides are, for example, 4-methoxy-,2,4,6,-trimethyl-, 2,6-dimethoxy-, 3,4,5,-trimethoxy- and 3-nitrophenylazide.

A preferred embodiment of the method according to the invention is characterized in that 4-pentyloxyphenylazide is used. A polymer film based on this substance proved to be flexible.

The phenylazide may be prepared from phenylhydrazine according to a method described by R. O. Lindsay and C. H. F. Allen in "Organic Synthesis", Wiley New York, 1955, Coll. Vol. III, p. 710. The substituted phenylazides are prepared from commercially available corresponding anilines, making use of the general method described in P. A. S. Smith and M. H. Boyer, "Organic Synthesis", Wiley, New York 1963, Coll. Vol. IV, p. 75.

Another embodiment of the method according to the invention is characterized in that the polymer is provided on the substrate surface according to a predetermined pattern by means of a mask which is located between an ultraviolet light source and the substrate. Photopolymerization only takes place in the exposed areas of the substrate surface. In the areas of the substrate surface which are shielded from the ultraviolet light no photopolymerization takes place. In this way a polymer in the form of a pattern can be provided on a substrate. When the mask is located on the substrate, on the side of the phenylazide vapour, polymer traces can be grown having dimensions of approximately 1 $\mu$m. The mask may also be situated on the side of the substrate facing away from the phenylazide vapour. Generally this adversely affects the resolution which depends upon the thickness of the (UV-transparent) substrate.

An embodiment of the method according to the invention is characterized in that the polymer is made electrically conductive by oxidizing it. In this process all heterocyclic member 7-rings of the polymer chain are oxidized, the positive charges being stabilised by delocalisation in the conjugated system (see Formula 1b). The positive charges on the polymer chains are compensated by negative counterions (doping) from the oxidant.

An embodiment of the method according to the invention is characterized in that the oxidation process is carried out using a substance selected from the group formed by arsenic pentafluoride and iodine. By subjecting the substrate surface carrying the poly-1,2-azepine to $AsF_5$- or $I_2$ vapour an electrically conductive polymer film is formed having a conductivity between $10^{-2}$ and $10^{-3}$ Scm$^{-1}$.

Also by means of the invention, substrates provided with a polymer according to the invention can be formed. This polymer may be provided in the form of a pattern if desired.

The invention will now be explained in more detail by means of the following exemplary embodiments:

EXAMPLE 1

A glass vessel 1, as shown in FIG. 1, is provided with an inlet pipe 6 having a stop cock 8 and an outlet pipe 7 having a stop cock 9. The vessel is also provided with a flange 2 which has an external screw thread 3. A quartz glass substrate 11 is positioned on this flange. A nut 4 having an internal screw thread is screwed on the flange, such that the substrate 11 is clamped between the flange 2 and the nut 4. A vacuumtight connection is formed by means of O-rings (not shown). At the bottom of the vessel 1 200 mg of phenylazide 10 are provided. Over the substrate 11 there is provided a OAI mercury lamp (not shown) which emits ultraviolet light in the range from 220 to 320 nm. When the space 12 has been evacuated via the pipe 7 and subsequently filled with nitrogen via the pipe 6, the UV light source is activated. On the substrate 11 a polymer film is formed whose layer thickness increases with time, as shown in FIG. 2. This Figure is a curve shows the absorption A (at a wavelength of 350 nm) of the film as a function of the irradiation time t in minutes. The absorption is proportional to the layer thickness of the film. As the layer thickness of the film increases the intensity of the UV radiation on the reaction side decreases due to absorption, consequently the increase in the layer thickness decreases with time. In the present example a layer thickness of approximately 10 μm is attained in 30 minutes.

EXAMPLE 2

Using 3-nitro-phenylazide a polymer film is obtained in the same way as in example 1.

EXAMPLE 3

Using 4-pentyloxyphenylazide a polymer film is obtained in the same way aas in example 1. This film is more flexible than the one obtained when using methyl- or methoxysubstituted phenylazides.

EXAMPLE 4

The substrate carrying the polymer film obtained according to example 1, 2 or 3 is placed on a vessel according to FIG. 3. At the bottom of this vessel there is solid iodine. The vessel is heated in an oven to a temperature of 80° C. for 30 minutes After this treatment the polymer film exhibits an electric conductivity from $10^{-2}$ to $10^{-3}$ Scm$^{-1}$ measured using a four-point method.

What is claimed is:

1. A method of producing a polymer film or a substrate which method comprises bringing a surface of a substrate into contact with a vapor of a substituted phenylazide substituted with from 1 to 4 substituents selected from the group consisting of alkyl, alkoxy, aryl, halogen and an electron-acceptor group, exposing said thus-coated substrate to UV light thereby causing said phenylazide to polymerize to form a film, of a corresponding poly -1,2- azepine.

2. A method as claimed in claim 1, characterized in that 4-pentyloxyphenylazide is used.

3. A method as claimed in claim 1 characterized in that the polymer is provided on the substrate surface according to a pattern by means of a mask which is positioned between an ultraviolet light source and the substrate.

4. A method as claimed in claim 1, characterized in that the polymer is made electrically conductive by oxidizing it.

5. A method as claimed in claim 1, characterized in that the oxidation process is carried out using a substance selected from the group consisting of arsenic pentafluoride and iodine.

6. A substrate provided with a polymer which is obtained by using a method as claimed in claim 1.

7. A poly -1,2-azapine having a repeating unit of the formula

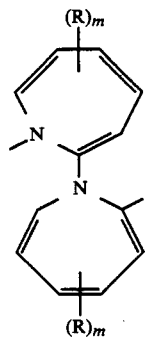

wherein R is a substituent selected from the group consisting of alkyl, alkoxy, aryl, halogen and an electron-acceptor group and m is 1,2 or 3-.

8. Poly -4- pentyloxy -1,2- azapine.

9. A poly-1, 2-azapine having a repeating unit of the formula

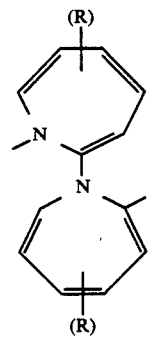

wherein R is pentyloxy.

* * * * *